(12) United States Patent
Hedler et al.

(10) Patent No.: US 6,864,575 B2
(45) Date of Patent: Mar. 8, 2005

(54) ELECTRONIC INTERFACE STRUCTURES AND METHODS

(75) Inventors: Harry Hedler, Germering (DE); Thorsten Meyer, Erlangen (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/195,958

(22) Filed: Jul. 16, 2002

(65) Prior Publication Data

US 2003/0052407 A1 Mar. 20, 2003

(30) Foreign Application Priority Data

Jul. 19, 2001  (DE) .......................................... 101 35 308

(51) Int. Cl.⁷ .............................................. H01L 29/40
(52) U.S. Cl. ..................... 257/734; 257/735; 257/736; 257/737
(58) Field of Search ................................ 257/734–741

(56) References Cited

U.S. PATENT DOCUMENTS

| | | | | |
|---|---|---|---|---|
| 4,813,129 A | * | 3/1989 | Karnezos | ....................... 29/832 |
| 5,329,423 A | * | 7/1994 | Scholz | ....................... 361/760 |
| 5,707,902 A | | 1/1998 | Chang et al. | |
| 5,854,514 A | | 12/1998 | Roldan et al. | |
| 6,177,729 B1 | * | 1/2001 | Benenati et al. | ............. 257/738 |
| 6,329,827 B1 | * | 12/2001 | Beaman et al. | ............. 324/754 |
| 6,388,321 B1 | * | 5/2002 | Hirai et al. | .................. 257/737 |
| 6,551,861 B1 | * | 4/2003 | Lin | ............................ 438/118 |
| 2002/0084528 A1 | * | 7/2002 | Kim et al. | ................... 257/773 |

FOREIGN PATENT DOCUMENTS

| | | |
|---|---|---|
| DE | 10045043 A1 | 4/2001 |
| JP | 5-275489 | 10/1993 |

\* cited by examiner

*Primary Examiner*—Wael Fahmy
*Assistant Examiner*—Nathan W. Ha
(74) *Attorney, Agent, or Firm*—Jenkins, Wilson & Taylor P.A.

(57) ABSTRACT

Electronic component, in particular a chip, which can be electrically bonded by means of a plurality of contacts provided on the component to mating contacts provided on a carrier, each contact having a raised elastic base of a conductive material which is connected to a lead on the component side, and to which there is applied on the upper side a metallic cap-like contact covering, only partially covering the base.

8 Claims, 2 Drawing Sheets

ELECTRONIC INTERFACE STRUCTURES AND METHODS

TECHNICAL FIELD

The invention relates to an electronic component, in particular a chip, which can be electrically bonded by means of a plurality of contacts provided on the component to mating contacts provided on a carrier.

BACKGROUND ART

The mounting of components in chip form in particular presents major problems with regard to reliable bonding of the chips with at the same time secure attachment of the same, it being intended for the attachment to take place on the carrier with as little stress as possible. Leadframe-type packages, ball-grid-array packages (BGAs) and chip-size packages (CSPs) are known. All have the task of connecting the chip to the carrier with as little stress as possible, which is a demanding task, in particular with regard to possible temperature changes, since the linear expansion is very different between the component, that is the chip, and the carrier. In the [lacuna] leadframe packages, this function is undertaken by the elastic leadframe, in the case of the ball grid arrays and the chip-size packages it is undertaken by the solder balls, which are arranged on the mounting feet and by means of which the components are attached to the carrier, the solder balls being made to reflow in a temperature step, thereby bringing about the connection to the carrier with simultaneous electrical bonding. Recently, the latter type of attachment in particular has been used increasingly, but it also entails problems. On the one hand, the placement of the solder balls is laborious and complex, and on the other hand the attachment requires an additional temperature step, which is relatively long, since complete reflow of the solder ball has to be ensured, which consequently has adverse effects on the component and/or the carrier. In addition, this connection is not elastic, that is to say it can scarcely offer security against movement of the chip in the x/y direction to the extent that the connection is not broken under such loading.

The invention is based on the problem of providing a component which can be reliably mounted and electrically bonded in a simple way even with a high number of contacts.

To solve this problem, in the case of an electronic component of the type stated at the beginning it is provided according to the invention that each contact has a raised elastic base of a conductive material which is connected to a lead on the component side, and to which there is applied on the upper side a metallic cap-like contact covering, only partially covering the base.

SUMMARY OF THE INVENTION

The invention firstly proposes replacement of the solder ball by the elastic base, which is raised and consequently protrudes from the plane of the mounting side of the component, such a base being assigned to each contact. This base is of conductive material, that is to say it has a bulk conductivity. It thus has not only the function of compensating for any movements of the chip, on the basis of its elasticity, but also a conducting function.

The base is connected on the component side to a corresponding lead, which leads to the contact; applied on the upper side is a metallic cap-like contact covering, which only partially covers the base and by means of which the contact is bonded to the mating contact on the carrier.

This configuration according to the invention offers a series of advantages. Firstly, the use of a base of conductive material makes it possible to dispense with a wiring or interconnect running on the outer side of the base from the mounting side to the tip of the contact. This is so because use of the conductive material means that the electrical conduction in this part takes place through the volume of the elastic base itself. This increases the reliability and service life of the component, since, when there are any movements of the base, a wiring running on its outer side can have the tendency to tear on account of the stresses caused by the movement, resulting in failure of the component. A further advantage of dispensing with an interconnect running on the base is that, during subsequent attachment of the component in a soldering process, the solder cannot flow along the interconnect, which would lead to a stiffening of the base.

The cap-like contact covering applied only to the upper side ensures the freedom of movement of the elastic base both in the x/y direction and in the z direction, that is when the chip is mounted on the carrier, onto which it is for instance pressed. The metal is only at the place where it is required, that is on the head of the contact, thus in the direct contact region with respect to the mating contacts. The metal provides a low contact resistance.

A further advantage of the construction according to the invention is that the component enters into an electrical contact by simple pressing onto a planar carrier and is consequently very easy to test. This permits a full-wafer test, in which several tens of thousands of contacts have to be closed simultaneously. The remaining attachment of the component to the carrier can take place for example with a conductive adhesive, with a solder or by the use of suitable pressing mechanisms (for example underfill, clamping etc.).

Since, according to the invention, each contact is assigned an elastic base of its own, it is expedient if the latter has a substantially conical or pyramidal form. It tapers in its cross section. The contact coverage, however, is expediently provided merely in the region of the tip of the base, that is to say it should not be drawn down all that far, since otherwise a stiffening of the elastic base occurs on account of the relatively thick metal covering and it becomes too rigid to compensate adequately for any stresses resulting from a displacement.

The base may, furthermore, have a very thin metallic coating, resulting from a metallic seed layer applied while the contact is being produced. For technical production-related reasons, it is expedient to work with a seed layer of this type, in order to accomplish reliable growth of the metal layer at the desired locations. This seed layer is in this case extremely thin and consequently very flexible, that is to say it does not influence the elasticity of the base, so that, in spite of everything, the latter completely retains its compensating effect. It is also not a problem if this metallic coating tears or breaks during operation on account of any movements, since, as stated, the electrical conduction takes place through the base itself.

For simple electrical bonding of the base to the lead on the component side, the base is expediently applied on a contact pad connected to the lead. For secure connection of the base to the lead or the wiring in the chip level, a preferably annular metallic contact foot may be provided at the foot of the base, if appropriate in addition to the contact pad.

The base is expediently printed onto the component. The contact covering and/or the contact foot itself are expediently of an Au-covered carrier material.

In addition to the electronic component, the invention also relates to a method of producing the electronic component, in particular a chip, of the type described above, in which a raised elastic base of a conductive material is applied to the mounting side of the component for each contact to be produced there and is thereby connected to a lead on the component side, a metallic cap-like contact covering, which only partially covers the base, being applied to the base on the upper side. The base should, however, preferably have a conical or pyramidal form, such a form being achieved in particular by simple printing onto the base.

After applying the base, a very thin metallic seed layer, covering the mounting side, may be applied, onto which a photoresist layer is applied, subsequently exposed and partially removed for exposing the regions in which the contact coverings are to be applied, after which a further metallic layer is applied for forming the contact coverings and, subsequently, the remaining photoresist is removed.

As an alternative to this, after applying the base, a metallic layer may be applied, onto which a photoresist layer is applied, subsequently exposed and partially removed for exposing the regions outside the contact coverings in which the metallic layer is to be removed, after which the metallic layer is removed in the exposed regions, which can take place for example by simple selective etching with respect to the polymer base. As a difference from the aforementioned embodiment, in which the metallic layer which forms the contact coverings or the possible contact feet is only deposited where it is to be actually formed, in the case of the second-mentioned embodiment a thick metal layer is firstly applied, and subsequently removed again locally.

Depending on the way in which the method is devised, the photoresist is exposed and removed in such a way that, in addition to the contact coverings, a contact foot forming a connection of the conductive base to a lead on the component side is also produced or remains at each contact during the subsequent metal deposition or the subsequent layer removal, it being expedient, as already stated, for there to be formed at the lead a larger contact pad, onto which the base is then placed.

BRIEF DESCRIPTION OF THE DRAWINGS

Further advantages, features and details of the invention emerge from the exemplary embodiment described below and on the basis of the drawing, in which.

DETAILED DESCRIPTION OF THE DRAWINGS

Figure 1:
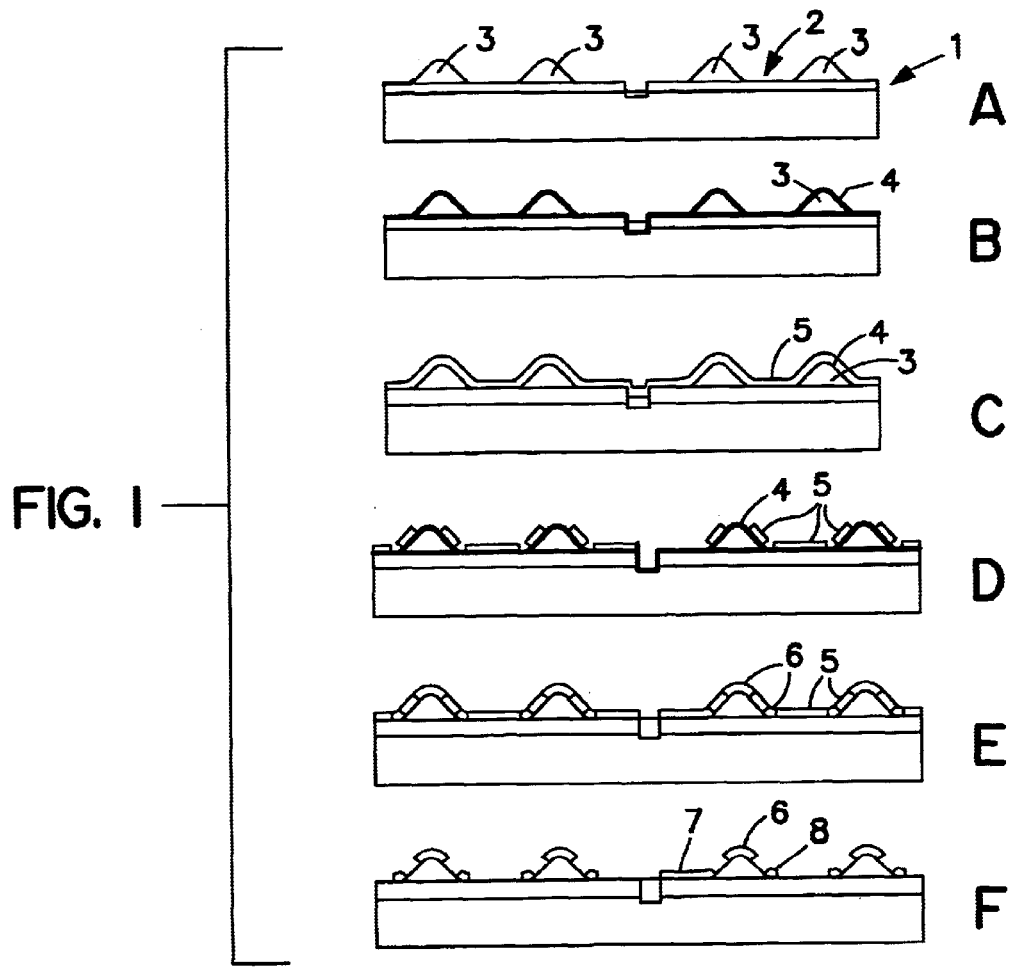
FIGS. 1A–1F shows a basic representation of the individual working steps for producing a component with a contact construction according to the invention.

FIG. 1 shows in step A firstly the electronic component 1 in the form of a chip, on the mounting upper side 2 of which a multiplicity of raised, elastic bases 3 of a conductive material are firstly applied in a conical or pyramidal form, in particular are printed on. These elastic bases serve for forming the contacts to be built up thereafter.

Subsequently, in step B, a metallic seed layer 4 is deposited over a large surface area, in particular by sputtering, this seed layer 4 being very thin.

Figure 2:
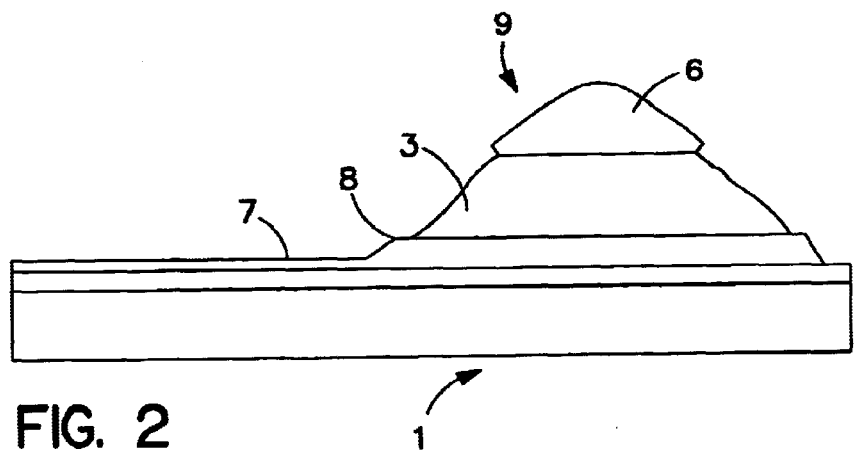
FIG. 2 shows an enlarged representation of a component with the contact construction according to the invention.

In step C, a photoresist layer 5 is applied to the seed layer 4, preferably by electrodeposition, and in step D is subsequently exposed and developed and subsequently removed, so that the photoresist merely remains at certain points. In the regions between the remaining portions of photoresist, the metallic seed layer 4 is exposed. In step E there is applied in these regions a direct metallic layer, which on the one hand forms the metallic cap-like contact covering 6 on the tip of the base 3, on other hand produces the lead 7 and a contact foot 8, which in the case of this embodiment brings about the bonding of the conductive base 2 to the lead 7. Subsequently, in step F, the remaining photoresist is removed, so that altogether the contact structure shown in an enlarged form in FIG. 2 is obtained. As described, the final contact 9 comprises on the one hand a raised, elastic and conductive base 3, to which a cap-like contact covering 6 is applied on the upper side, and which is connected on the underside to a lead 7 via a likewise metallic contact foot 8.

Figure 3:
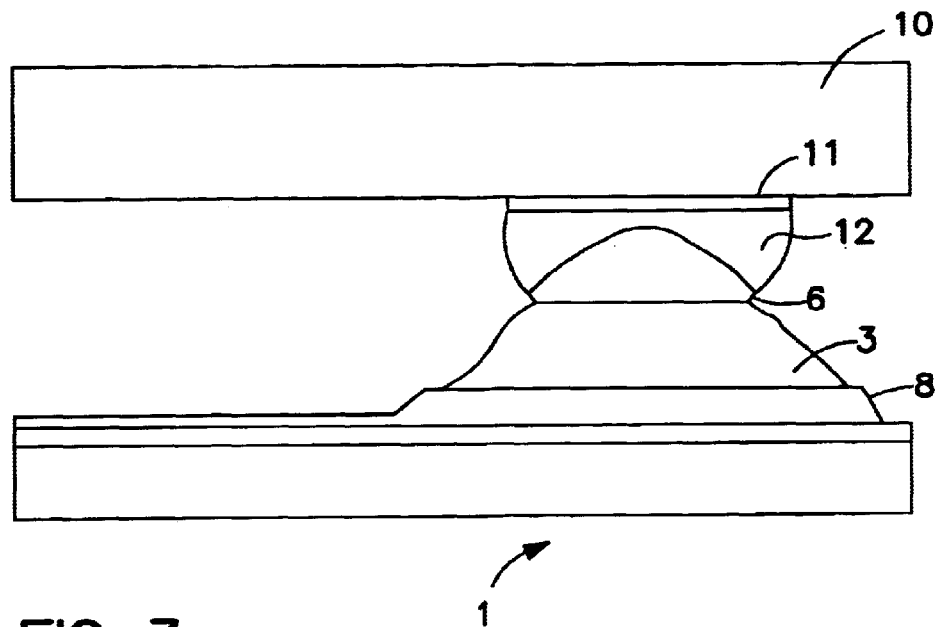
FIG. 3 shows a basic diagram to represent the attachment of the component according to the invention on a carrier.
Figure 4:
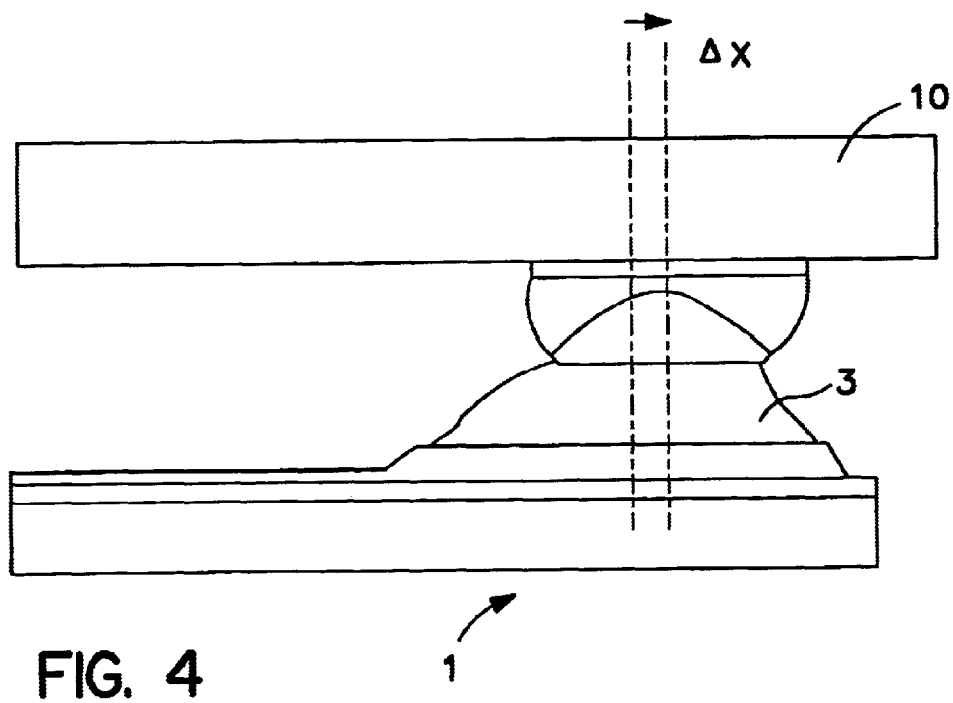
FIG. 4 shows the combination from FIG. 3 when there is a slight horizontal displacement of the component with respect to the carrier.

FIG. 3 shows a detail of the component 1 from FIG. 2 after its mounting on a carrier 10, for example a PC board, on which corresponding mating contacts 11 are provided, by means of which in each case a contact 10 of the component 1 can be electrically bonded. In the example shown, the connection takes place using a solder 12, but may also be equally brought about by a conductive adhesive or the like. It is evident that the connection takes place merely in the region of the cap-like contact covering 6; here, too, the exposed regions of the elastic raised base 3 are not covered. That is to say that the elastic base 3 retains its elasticity even after mounting, which leads to the result that, when a displacement of the component 1 with respect to the carrier 10 occurs, it is deformed and, on account of the deformation, any stresses normally resulting from the displacement are eliminated and compensated. This case is shown in FIG. 4, where the component 1 has been displaced with respect to the carrier 10 by a distance Δx. It is evident that the elastic base 3 likewise undergoes this displacement and is deformed somewhat. This does not change the conductive connection between the mating contact 10 and the contact 9 on the component side in any way, and the conductivity of the base 3 is also not influenced as a result.

A conductive polymer, which is preferably suitable for use in a printing process and can be printed onto the mounting side of the chip, is expediently used as the material for the elastic base.

List of Designations 1 component
2 mounting upper side
3 elastic bases
4 seed layer
5 photoresist layer
6 contact covering
7 lead
8 contact foot
9 contact
10 carrier
11 mating contact
12 solder

What is claimed is:

1. Electronic component, in particular a chip, which can be electronically bonded by means of a plurality of contacts provided on the component to mating contacts provided on a carrier, characterized in that each contact has a raised elastic base of a conductive material which is connected to a lead on the component side, and to which there is applied on the upper side a metallic cap-like contact covering the top portion of the base, and further comprising an annular contact foot at the foot of the base for connecting the base to the lead.

2. Electronic component according to claim 1, wherein the raised elastic base has a substantially conical or pyramidal form.

3. Electronic component according to claim 2, wherein the contact covering is provided merely in the region of the tip of the base.

4. Electronic component according to claim 1, wherein the base has a very thin metallic coating, resulting from a metallic seed layer applied while the contact is being produced.

5. Electronic component according to claim 1, wherein the conductive base is applied on a contact pad connected to the lead.

6. Electronic component according to claim 1, wherein the base is printed on.

7. Electronic component according to claim 1, wherein the contact covering and/or the contact foot are of an Au-covered carrier material.

8. An electrical interface structure for providing electrical connection to an electronic component, the structure comprising:

(a) a raised elastic base comprising conductive material, wherein the elastic base comprises a top and base portion, wherein the base is attached to an electronic component;

(b) a metallic contact covering the top portion of the elastic base for providing an electrical connection; and (c) an annular contact foot attached to the foot of the elastic base and to a lead for electrically connecting the metallic contact to the lead via the elastic base.

* * * * *